(12) United States Patent
Palgy (10) Patent No.: US 10,868,571 B2
(45) Date of Patent: Dec. 15, 2020

(54) ADAPTIVE-SCL POLAR DECODER

(71) Applicant: Sequans Communications S.A., Colombes (FR)

(72) Inventor: Michal Palgy, Colombes (FR)

(73) Assignee: Sequans Communications S.A., Colombes (FR)

( * ) Notice: Subject to any disclaimer, the term of this patent is extended or adjusted under 35 U.S.C. 154(b) by 0 days.

(21) Appl. No.: 16/355,425

(22) Filed: Mar. 15, 2019

(65) Prior Publication Data
US 2020/0295786 A1 Sep. 17, 2020

(51) Int. Cl.
*H03M 13/37* (2006.01)
*H03M 13/13* (2006.01)
*H03M 13/45* (2006.01)

(52) U.S. Cl.
CPC ....... *H03M 13/3707* (2013.01); *H03M 13/13* (2013.01); *H03M 13/455* (2013.01)

(58) Field of Classification Search
CPC ...... C23F 13/22; C23F 13/04; C23F 2213/31; G01N 17/02; G01N 17/04; H03M 13/3707; H03M 13/13; H03M 13/455
USPC .......................................................... 714/786
See application file for complete search history.

(56) References Cited

U.S. PATENT DOCUMENTS

| | | | | |
|---|---|---|---|---|
| 6,161,210 A * | 12/2000 | Chen | .................. | H03M 13/4115 375/262 |
| 6,718,502 B1 * | 4/2004 | Kuznetsov | ....... | G11B 20/10009 341/143 |
| 8,250,431 B2 * | 8/2012 | Yang | .................. | H03M 13/1105 714/755 |
| 8,489,972 B2 * | 7/2013 | Wong | ................ | H03M 13/4169 714/795 |
| 8,499,226 B2 * | 7/2013 | Gunnam | ............ | H03M 13/1128 714/755 |
| 2008/0036476 A1 * | 2/2008 | Nielsen | .................. | G01N 17/02 324/700 |
| 2010/0042865 A1 * | 2/2010 | Creigh | ................ | G01R 31/3004 713/503 |

(Continued)

OTHER PUBLICATIONS

Kumar, Valiveti, Ganesh, et al., "Implementation of Viterbi Decoder using T-Algorithm for TCM Decoders," International Journal of Innovative Research in Electrical, Electronics, Instrumentation and Control Engineering, 3(5):159-163 (2015).

(Continued)

*Primary Examiner* — Albert Decady
*Assistant Examiner* — Enam Ahmed
(74) *Attorney, Agent, or Firm* — Hamilton, Brook, Smith & Reynolds, P.C.

(57) ABSTRACT

A method of dynamically changing the list size of a successive cancellation list (SCL) decoder, the SCL decoder arranged to decode data received from a wireless communications system, the method comprising at each successive cancellation stage of the SCL decoder, determining a path metric of each path of the SCL decoder, selecting a differential path metric threshold, and dynamically changing the list size of the SCL decoder based on the differential path metric threshold and the path metric of each path of the cancellation stage, such that decoding sensitivity of the decoder is maintained and/or latency and error-correction performance of the decoder are balanced.

14 Claims, 7 Drawing Sheets

(56) References Cited

U.S. PATENT DOCUMENTS

2013/0007568 A1* 1/2013 Okamura .......... H03M 13/2978
714/786
2017/0149531 A1* 5/2017 Raza ....................... G06F 11/10
2017/0366204 A1* 12/2017 Shi ......................... H04L 25/061

OTHER PUBLICATIONS

Zhang, Chuan, et al., "Efficient Adaptive List Successive Cancellation Decoder for Polar Codes," Asilomar, IEEE, 126-130 (2014).
Li, B., et al., "An Adaptive Successive Cancellation List Decoder for Polar Codes with Cyclic Redundancy Check," IEEE, (2012).
Henning, R., et al., "Low-Power Approach for Decoding Convolutional Codes with Adaptive Viterbi Algorithm Approximations," Department of Electrical Engineering, Arizona State University (2002).

* cited by examiner

No transformation     Two instances     Eight instances Figure 1A     Figure 1B     Figure 1C Figure 2A     Figure 2B     Figure 2C

ADAPTIVE-SCL POLAR DECODER

TECHNICAL FIELD

This disclosure relates to decoding incoming data from a wireless communications system. It is particularly suited to utilization within a successive cancellation list polar decoder.

BACKGROUND

As an introduction, some known decoder schemes are discussed. For a polar code of length N, encoding complexity is of $O(N \log_2 N)$. Decoding complexity with a successive cancellation (SC) decoder is also of $O(N \log_2 N)$. With more advanced decoders having better performance for moderate code lengths, an SC-List (SCL) decoder is of complexity $O(LN \log_2 N)$ for a list size of L.

For moderate code lengths, for example 1024-bit block length, an SC decoder exhibits mediocre error-correction performance. SCL decoding with Maximum-Likelihood (ML) estimation improves the performance; however, performance is still limited for codes of moderate length. List decoding with CRC-Aid (CA) resolves that issue and provides excellent error-correction performance, increasing neither the computational complexity of the encoder nor that of the decoder by a notable amount. Note that the CA-SCL polar decoder was adopted by 3GPP-NR RAN1 for the evaluation of polar decoding performance. For simplicity, in this document, 'CA' is omitted from notation, and CA-SCL is referred as SCL.

Implementation complexity of the List decoder increases with increasing list size, especially with large block sizes. Furthermore, Polar codes cannot be parallelized like Turbo codes and low-density parity check codes (LDPC).

In relation to parallelization, as is known, Turbo and LDPC codes are decoded in an iterative manner where for each iteration a Belief Propagation algorithm is applied. For Turbo codes this is BCJR (Bahl, Cocke, Jelinek, Raviv) and for LDPC this is with message passing between variable and check nodes.

In an SC-based Polar decoder, every sequential bit estimation within the codeword depends on the outcome of its previous bits' estimations. Moreover in SCL-based Polar decoder, the L paths cannot be parallelized since they are originated from ongoing codeword candidates. This means that latency issues for large block-lengths can be important.

The Chase-SC decoder has been shown to improve the performance of SC decoding. As is known, a Chase-SC decoder validates a codeword at the end of the SC decoding process with CRC. If the codeword does not satisfy the CRC constraint, an error pattern is selected and the SC decoding process is restarted. If the decoding fails, the next most likely pattern is chosen and the process is repeated until decoding succeeds or a maximum number of attempts has been reached. SCL decoding performs similarly to Chase-SC with a list size of 2 and better with a list size of 8. However, the implementation cost (processing power, PCB real-estate etc.) associated with SCL decoding is significantly higher. Further, enough associated memory must be allocated to investigate all paths in the list decoder as would be understood.

Accordingly there is a need to provide a decoder that improves latency without degrading error-correction, as well as minimizing resource overhead such as silicon area, associated component count and PCB real-estate.

SUMMARY

According to an aspect there is provided a method of dynamically changing the list size of a successive cancellation list (SCL) decoder, the SCL decoder arranged to decode data received from a wireless communications system, the method comprising, at each successive cancellation stage of the SCL decoder, determining a path metric of each path of the SCL decoder, selecting a differential path metric threshold, dynamically changing the list size of the SCL decoder based on the differential path metric threshold and the path metric of each path of the cancellation stage, such that decoding sensitivity of the decoder is maintained and/or latency and error-correction performance of the decoder are balanced.

Optionally, the method wherein dynamically changing the list size of the SCL decoder comprises comparing the median path metric with the lowest path metric of the cancellation stage of the SCL decoder, and if the difference is more than the differential path metric threshold, half of the paths are removed from the subsequent cancellation stage of the SCL decoder.

Optionally, the method further comprising if the difference in comparing the median path metric with the lowest path metric of the cancellation stage of the SCL decoder is not more than the differential path metric threshold, the amount of paths is doubled to the subsequent cancellation stage of the SCL decoder up to a limit of the list size.

Optionally, the method wherein determining the path metric comprises determining according to a maximum-likelihood metric.

Optionally, the method wherein the path metric is indicative of the maximum likelihood metric of a path.

Optionally, the method wherein path metrics are determined when a frozen bit is encountered wherein the number of paths remain the same.

Optionally, the method wherein path metrics are determined when a data (information) bit is encountered wherein the number of paths is doubled.

Optionally, the method wherein selecting a differential path metric threshold is based on the peak to peak amplitude of the input data log-likelihood-ratio statistics and the code rate.

Optionally, the method wherein the differential path metric threshold is proportional to the peak to peak amplitude of the input data log-likelihood-ratio statistics and inversely proportional to the code rate.

Optionally, the method wherein code rate comprises $D/(F+D)$ where D is the number of data (information) bits and F is the number of frozen bits per code-block of size $N=D+F$.

Optionally, the method wherein the decoder comprises a pre-determined list size, the method further comprising reducing the list size of a successive cancellation stage of the list decoder to equal the pre-determined list size when the number of paths of the successive cancellation stage is more than the pre-determined list size of the decoder.

Optionally, the method wherein a codeword candidate (path) is discarded after partial decoding if an associated CRC fails.

In an aspect there is provided a receiver arranged to receive communication data, the receiver comprising a successive list cancellation decoder according to the method.

In a further aspect, there is provided a non-transient computer readable medium comprising instructions that when executed by a processor, cause a processor to carry out the method.

BRIEF DESCRIPTION OF THE DRAWINGS

Embodiments will now be described, by way of example only, and with reference to the drawings in which.

In the figures, like elements are indicated by like reference numerals throughout.

INTRODUCTION TO POLAR CODES

Figure 1A:
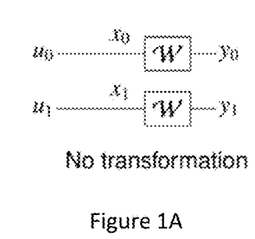
FIGS. 1A to 1C illustrate instances of polar codes.

A polar code is a linear code based on a simple polarization transform, constructed from basic transforms to create block size $N=2^n$ (the code length). Turning to FIG. 1A, where a circle with a plus is an XOR operation, FIG. 1B illustrates the basic transform and FIG. 1C illustrates a size-8 construction that involves 3-stages, $S_1$, $S_2$ and $S_3$.

FIG. 1A illustrates the case of no-transformation, where two bits ($u_0$, $u_1$) are transmitted using two independent binary memoryless channels W, thus their mutual information is the same: $I(y_0, y_1; u_0)=I(W)=I(y_0, y_1; u_1)$.

Figure 1B:
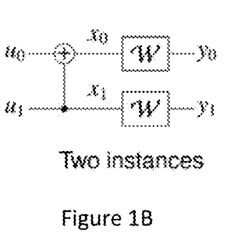
Figure 1C:
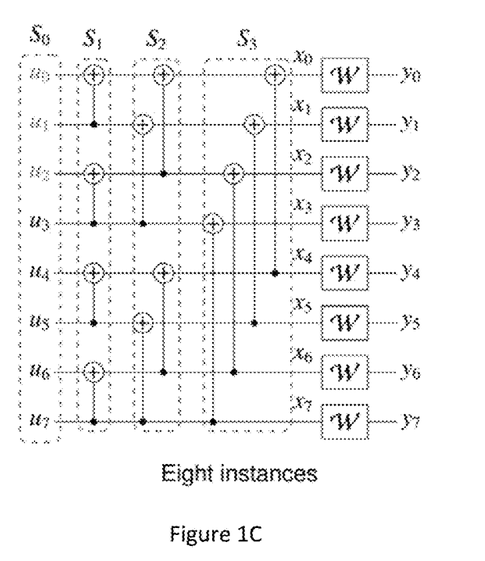

However, if ($u_0$, $u_1$) are transmitted so that $x_0$=XOR($u_0$, $u_1$) and $x_1=u_1$, as shown in FIG. 1B, then the mutual information becomes: $I(y_0, y_1; u_0) \leq I(W) \leq I(y_0, y_1; u_1)$.

In other words, the probability of correctly estimating $u_0$ decreases while that of $u_1$ increases.

The Polar code construction exploits this channel polarization phenomenon. In the extreme case (code length goes to infinity), certain bits are always estimated reliably while others are completely unreliable when decoding using successive cancellation, hence the name "Polar codes". The un-coded bits' locations with the highest reliability are chosen to transmit the information bits and the other locations are frozen (set to a known value). For example, the three least reliable bits in FIG. 1C are highlighted in grey ($u_0$, $u_1$, $u_2$) and are set to '0' as in 3GPP NR specifications for the Polar coding.

Since the Polar code construction is recursive, a binary tree is a natural representation where each node corresponds to a constituent code. In SC decoding, the tree is traversed depth-first. SC decoding estimates bits sequentially starting with $\hat{u}_0$. Once the estimates to $\hat{u}_0$ to $\hat{u}_{i-1}$ are available, the next bit $\hat{u}_i$ is estimated. At node v, corresponding to a constituent code of length $N_v$, the vector $\alpha_v$ contains the $N_v$ soft LLRs inputs to the constituent code, and the vector $\beta^v$ contains the $N_v$ hard bit estimates. Each subtree at distance j from leaf-nodes is a constituent code of length $N_v=2^j$.

Latency Evaluation

Figure 2A:
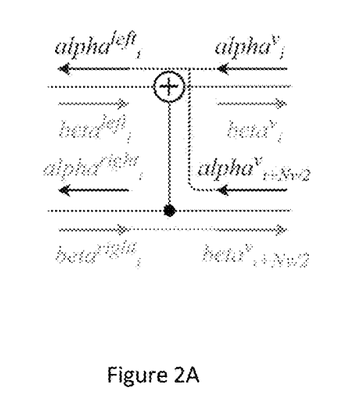
FIGS. 2A to 2C illustrate the order of the progressive calculation at each SC decoder stage.
Figure 2B:
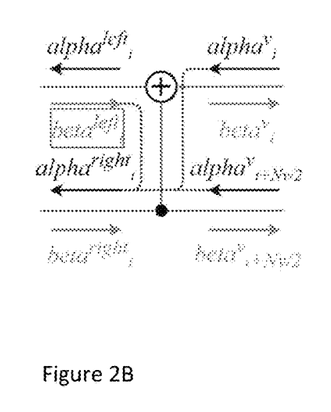
Figure 2C:
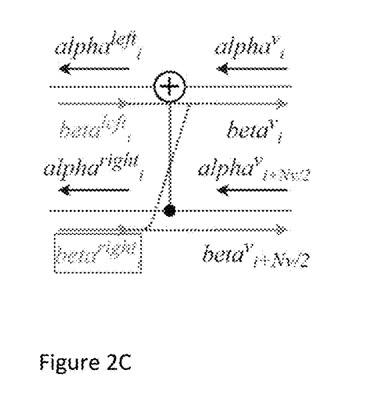

At each SC decoding stage, the order of the progressive calculation is as illustrated in FIGS. 2A to 2C. First, the value of $\alpha^{left}$ is calculated according to $\alpha^v$ from a higher stage FIG. 2A. The value of $\alpha^{right}$ is calculated only when the value of $\beta^{left}$ is available FIG. 2B, and the value of $\beta^{left}$ is calculated at a lower stage. Finally, when the values of $\beta^{right}$ are available, the values of $\beta^v$ are updated for the higher stage FIG. 2C.

For the evaluation of the SC Polar decoder latency, we consider at each traversed node one time step (or clock cycle) to compute $\alpha^{left}$, another to compute $\alpha^{right}$ and the last to compute $\beta$; therefore the latency of each node will be three clock cycles for every two bits, thus 3/2 clock cycles per bit.

For SCL Polar decoder, the path-metric (PM) calculation adds N more time steps to the decoding process, for each of the 2L evaluated paths.

$$PM_l = \sum_{n=0}^{N} \ln\left(1 - e^{-(1-2\beta_{n,l}^v)\alpha_{n,l}^v}\right)$$

SCL decoder complexity is of $O(3/2N \log_2 N)$ clock cycles.

However this evaluation alone does not take into account the complexity of the back and forward tree traversal.

Latency is evaluated according to two measurements, clock cycles and tree traversal. Time steps (or clock cycles) are counted for each calculation of $\alpha^{left}$, $\alpha^{right}$, $\beta$ and PM; nodes are counted when traversed during the decoding process.

The clock cycles' count is lacking the complexity of the back and forward tree traversal but on the other hand the nodes' count is lacking the complexity of each node calculation that can vary with the node size and type. Thus we can combine both clock cycles' and nodes' count to have a more realistic latency evaluation. The practical decoder latency is the product of these measurements.

The throughput of SC decoding can be improved when applying known simplified-SC (SSC) and known fast-SSC decoding techniques, while preserving the same performance. These techniques identify particular information bit and frozen bit patterns, reducing the decoding latency of SC by reducing its tree traversal with no error-correction performance degradation.

Four special patterns are associated with nodes in the decoding tree: Rate-0 nodes (with no information bits), Rate-1 nodes (with no frozen (constant) bits), Repetition (Rep) nodes with a single information bit at the end and Single-Parity-Check (SPC) nodes with a single frozen bit at the beginning.

Adaption of Special Nodes to List Decoder

For an SCL decoder, a path metric (PM) is updated when encountering a frozen bit, or when the path is created at a data (information) bit according to the following Maximum-Likelihood (ML) metric:

$$PM_{i,l} = \sum_{n=0}^{i} \ln\left(1 - e^{(1-2\hat{u}_{n,l})\alpha_{n,l}}\right) = PM_{i-1,l} + \ln\left(1 - e^{(1-2u_{i,l})\alpha_{i,l}}\right)$$

PM can be considered as a path cost function, and the L paths with the lowest cost are allowed to survive as would be understood.

At a special node v (Rate-0/Rate-1/Rep/SPC), corresponding to a constituent code of length $N_v$, the PM of the special node is updated according to $\beta^v$ at the node stage instead of the node's final decoder outputs û:

$$PM_{i+N_v-1,l} = PM_{i-1,l} + \sum_{n=i}^{i+N_v-1} \ln\left(1 - e^{-(1-2\beta_{n,l}^v)\alpha_{n,l}^v}\right)$$

The PM update is crucial for list decoding and cannot be skipped. However, having only straightforward PM calculation is not enough since the error-correction performance of Fast-SSCL is worse than of SCL.

The "Enhanced-Fast-SSCL" decoder incorporates SCL with Fast-SSC decoders, excluding the SPC nodes, and preserves the error correction performance of SCL decoding.

The "Further-Enhanced-Fast-SSCL" decoder incorporates SCL with Fast-SSC decoders, including the SPC nodes, however its error-correction performance is slightly degraded compared to that of the SCL decoder.

The Enhanced-Fast-SSCL algorithm significantly reduces the latency of Polar SCL decoders by an order of magnitude compared to the regular SCL decoder.

DETAILED DESCRIPTION

An adaptive SCL decoder is disclosed that introduces a differential threshold to dynamically change the list size of each successive cancellation stage while maintaining error correction performance; such an adaptive decoder has an effective list size that is not necessarily a power of 2. In effect, a sub-optimal (lower) effective list size can be chosen to provide flexibility to balance latency and error correction performance. In short, the present disclosure provides latency performance of an SC decoder and the block error rate (BLER) performance of a list decoder without their drawbacks (mediocre error correction performance and low throughput respectively).

With SC decoding, when an information bit is encountered in the decoding process, a 'hard' decision is taken for it based on the sign of its related log-likelihood ratio (LLR) as would be understood.

List decoding improves the error-correction performance by considering both possible values '0' and '1' at the hard decision stage. At every estimation, the number of codeword (CW) candidates (paths) doubles, wherein a codeword includes the data (information) bits, and not the frozen (constant) bits. When the number of paths exceeds the list size L, the list is pruned by retaining only the L most reliable paths. This means that half of the paths are discarded. The L paths cannot be parallelized since they are originated from ongoing CW candidates as explained earlier.

A method of dynamically changing list size by way of an adaptive SCL decoder will now be described with reference to FIGS. 3 and 4 which illustrate examples for a payload size of 4 bits, a block size of 16 bits and a pre-determined list size L of 8 at SNR of 4 dB. The lighter grey circles in FIG. 4 are the eliminated paths. As can be seen from FIG. 3 (without the disclosed adaptive SCL where the list is reduced to 8 and so the 8 most reliable paths are retained) and FIG. 4 (with the disclosed adaptive SCL), more paths are eliminated with adaptive SCL only at the lowest leaves. However, for longer block sizes it will be understood that that the tree will be deeper (i.e. more stages) and thus there would be more eliminated paths during the decoding process.

On the transmitter side, every codeword is encoded separately and the coded blocks are concatenated to include all of the data, optionally with added error-detecting code (e.g. CRC) for validation at the decoder side. At a receiver, raw data to be decoded is received from a wireless communications system, and when decoded by a decoder, comprises data (information) bits and frozen bits, where a frozen bit is set to a known value. The data is split into codewords, a codeword being the un-coded data bits excluding the frozen bits.

Figure 5:
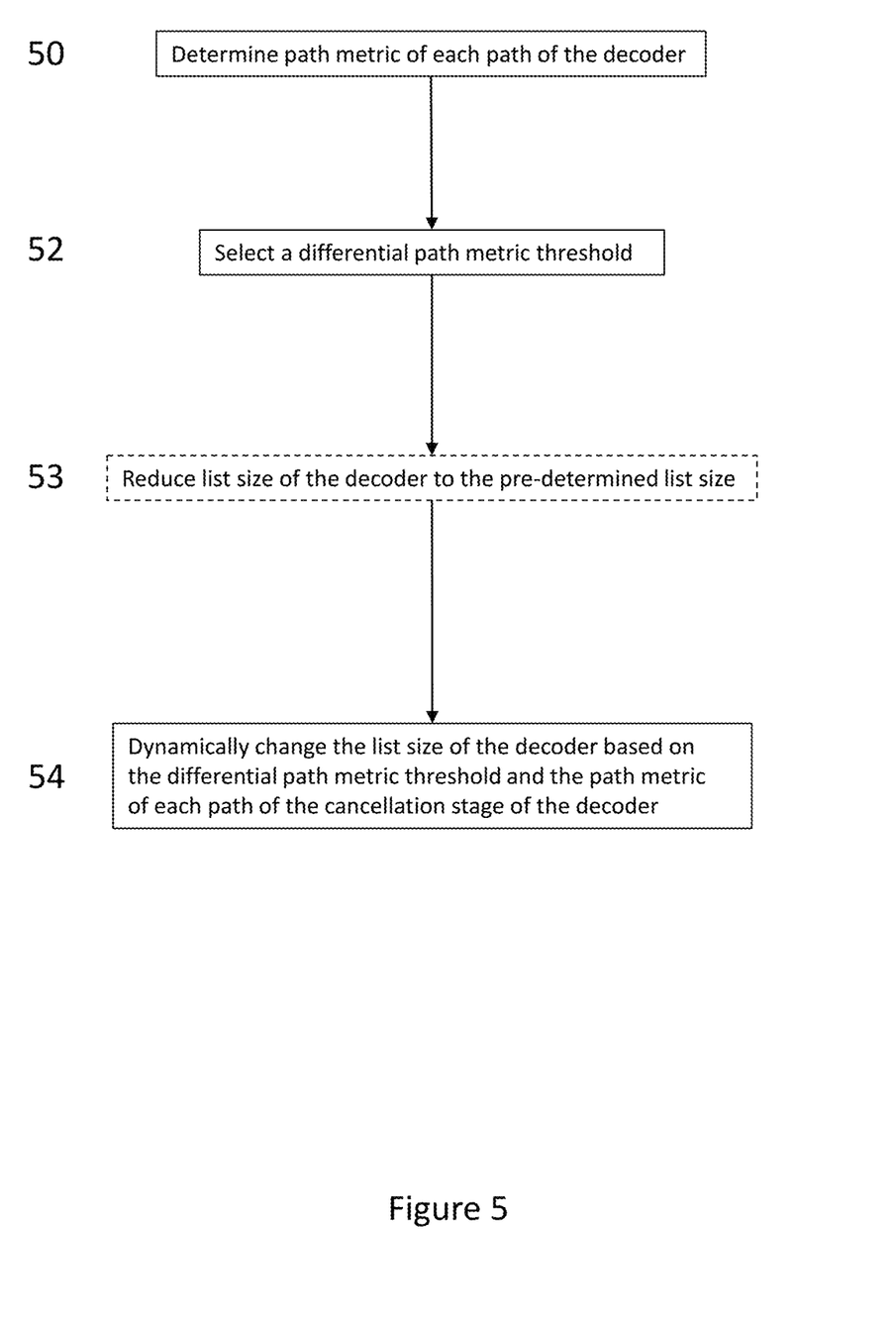
FIG. 5 illustrates a method of dynamically changing the list size of an SCL decoder.

Turning to FIG. 5, in step 50, the PM of each path of the SCL decoder is determined. This may be determined according to the maximum-likelihood. PM can be considered as a path cost function, and the L paths with the lowest costs are allowed to survive at each successive cancellation stage according to list decoder operation.

In step 52, a differential PM threshold is selected. This threshold allows both a reduction in latency and an increase in decoding sensitivity as the decode tree is traversed. As would be understood, the decoding sensitivity is higher when the list size is higher.

In step 54, the list size can be dynamically decreased or increased again (up to predefined list size L) during the decoding process based on the differential PM threshold and the PM of each path of the cancellation stage of the decoder as will be explained.

Turning to FIG. 4, where the threshold is set at 76.7, at the second hard decision stage, 40, the lowest path metric is 3.0. The median PM is 69.9. As 69.9−3.0<76.7, the intermediate list size (not at the leaves) is doubled, while upper-bounded by list size, L, which may be considered to be a predetermined list size.

At the third hard decision stage, 42, the lowest path metric is 3.0. The median PM is 82.2. As 82.2−3.0>76.7, the list size is decreased in that half of the paths are removed from the subsequent (cancellation) stage of the SCL decoder. Generically, where currL=the current (intermediate) list size, the paths are sorted in ascending order, and $PM_{currL/2}$=the median, if $PM_{currL/2}-PM_0>=T$, half of the paths are discarded.

As can be seen, when both possible values '0' and '1' at a hard decision stage have about the same probability (i.e. about the same PM), the differential threshold will not be crossed, the list size will not be decreased and thus the decoding sensitivity is maintained.

The differential threshold is crossed when half of the paths have a sufficient lower probability in relative terms to the other half of the paths. And in this case, decreasing the list size would not affect the decoders' sensitivity (compared to that of an SCL decoder with a fixed list size L) since the correct CW (from the SCL decoder standpoint) is not related to any of the discarded paths.

With this method, sensitivity is maintained when all of the current paths have approximately the same PM. Selecting the threshold to evaluate when the current paths have about the same PM and when they have sufficiently different PMs such that decreasing the list size does not affect decoder sensitivity will be explained later.

In other words, paths are split only when both possible values '0' and '1' at the hard decision stage have about the same probability (i.e. about the same PM).

The latency of such an adaptive SCL decoder is $O(L_{eff} N \log_2 N)$. In very bad SNR conditions (BLER close to 1) there would be many splits and hence the effective list size $L_{eff}$ would be close to L.

In very good SNR conditions (BLER close to 0) there would not be splits at all and the effective list size $L_{eff}$ would be close to 1.

Figure 3:
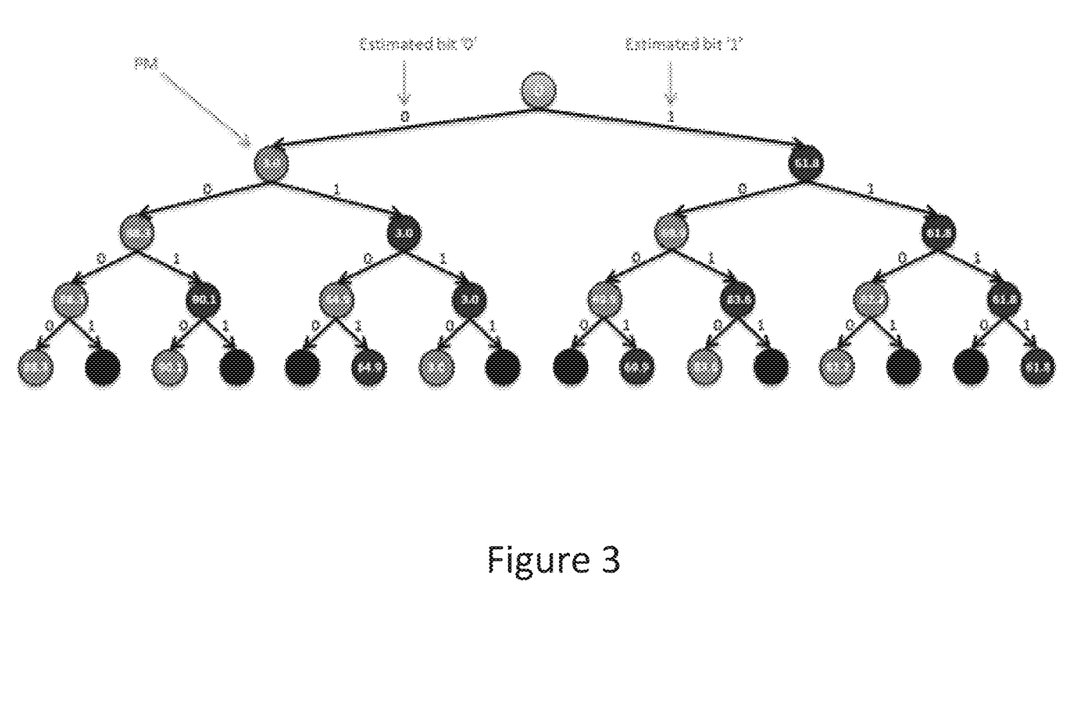
FIG. 3 illustrates a tree of an SCL decoder without adaptive list size.
Figure 4:
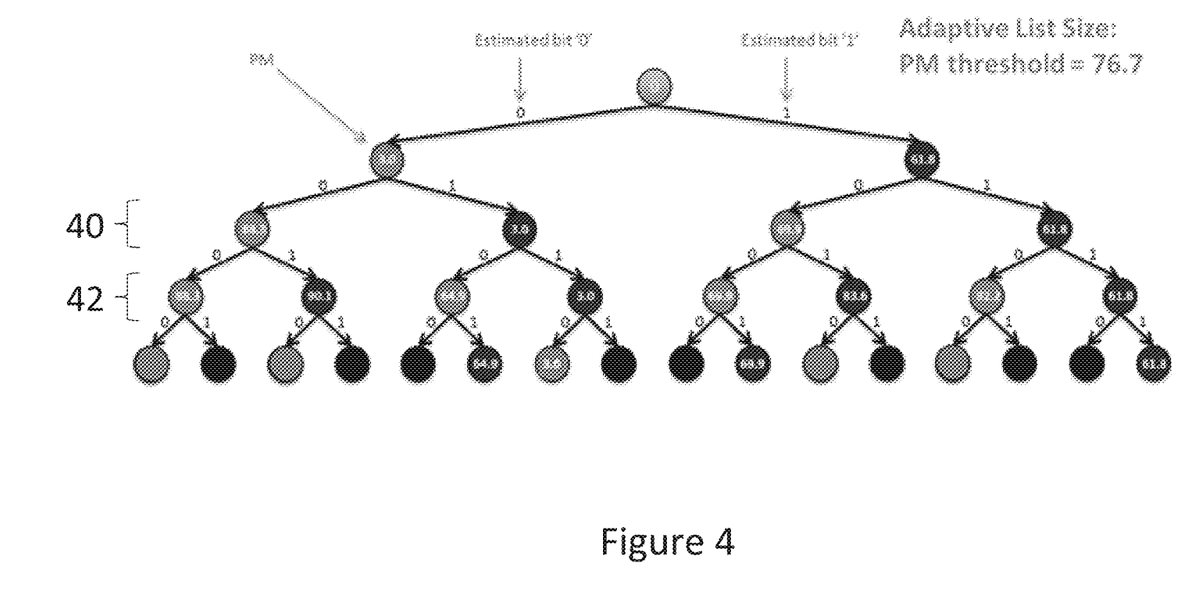
FIG. 4 illustrates a tree of an SCL decoder with adaptive list size.

The method of the adaptive SCL decoder may also perform list pruning as per FIG. 3 when the number of paths exceeds the pre-determined list size, that is to say the list size of a successive cancellation stage of the list decoder is reduced to equal the pre-determined list size when the number of paths of the successive cancellation stage is more than the pre-determined list size of the decoder. This is shown in optional dashed step 53.

In more detail, the implementation of FIG. 4 will now be described, in particular, selection of the differential PM threshold which is based on the peak to peak amplitude of the input data log-likelihood-ratio statistics (sometimes referred to as input LLRs herein) and the code rate.

The selection of the threshold has a direct effect on the performance degradation (e.g. if threshold T is set too low) and latency increase (e.g. if threshold T is set too high). The differential PM threshold is selected so that error-correction performance is preserved while achieving minimum latency (maximum throughput).

The soft coded bits that arrive from the equalizer of the modem receiver and are inputs to the decoder are the log likelihood ratios. The goal of the decoder is to output the un-coded bits which are the data bits that were desired to be communicated to the receiver.

In the adaptive SCL decoder, for a new hard bit estimation $\beta$ and its related LLR $\alpha$, the addition carried out to determine a path metric may be approximated according to $|\alpha|$ when $2\beta = 1 - \text{sgn}(\alpha)$ and 0 otherwise.

In more detail, the exact addition for the PM for a new hard bit estimation $\beta$ and its related LLR $\alpha$ is as follows $\Delta_{PM}(\alpha, \beta) = \ln(1 - e^{-(1-2\beta)\alpha})$.

The exact calculation for the PM update can be rewritten using the Jacobi logarithm $$\Delta_{PM}(\alpha, \beta) = f_{Jacobi-Log}((1-2\beta)\alpha)$$

Using the following approximation for the Jacobi logarithm $$f_{Jacobi-Log}(\lambda) = \begin{cases} 0, & \text{when } \lambda > 0; \\ -\lambda, & \text{otherwise} \end{cases}$$

yields the following hardware-friendly approximation $$\Delta_{PM}(\alpha, \beta) \cong \begin{cases} 0, & \text{when } 2\beta = 1 - \text{sgn}(\alpha); \\ |\alpha|, & \text{otherwise} \end{cases}$$

The threshold T is preferably be proportional to the standard deviation of the input LLRs. The addition to the PM is approximated according to $|\alpha|$, therefore the threshold selection, which is a differential threshold between the PMs of the paths, is selected according to the maximal $|\alpha|$ in order not to degrade the decoders' sensitivity as explained before.

The maximal $|\alpha|$ is the maximal absolute value of the input LLRs to the decoder. For robustness, it is better to consider all the input LLRs and not just a single sample value. Therefore, as explained in the following paragraph, the standard deviation (RMS) can evaluate peak-to-peak amplitude (which is double $|\alpha|$), and thus the threshold is preferably proportional to the RMS of the input LLRs.

The input LLRs to the decoder are assumed to have normal distribution (AWGN). Peak-to-Peak amplitude of the input LLRs can be approximately calculated from Root Mean Square (RMS) values $$P2P(\text{LLRs}) \cong 2\sqrt{2} \times \text{RMS}(\text{LLRs}).$$

This calculation is taken from a pure sine wave as would be understood. If the RMS calculation is too expensive from an implementation standpoint, the maximal absolute LLR value may be used instead.

Rather than calculating the variance of the input data LLRs, the variance of the wireless communication channel LLRs might already be known to the modem of the receiver.

The variance of the channel LLRs is not expected to vary highly dynamically and it should be easily estimated by long term averaging. At low SNR values, the channel LLRs' variance is expected to be proportional to the noise variance which is already estimated in the modem. This is because in low SNR values, the noise dominates the desired data signal and thus after equalization (of the signal), the variance of the channel LLRs is proportional to the noise variance. As would be understood, equalization is the process of estimating symbol constellation point (or modulation) by reversing the channel effect and optionally also considering the noise statistics (e.g. maximal ration combining, MRC, minimum mean-squared error, MMSE and soft-ML equalizers). The output of the equalizer is the channel LLRs.

At high SNR values, the channel LLRs' variance is expected to be proportional to the channel estimation power gain which is also available in the modem. This is because in high SNR values, the noise is negligible and thus after equalization (of the signal) we get that the variance of the channel LLRs is proportional to the channel estimation power gain.

The variance of the channel LLRs can be converted to the variance of the input LLRs according to the used rate matching scheme, for example in 3GPP-NR, the channel LLRs are either a repetitive sequence of the input LLRs to the decoder (in the case when more bits (E) are transmitted in the channel than the code block size (N), E>N), or otherwise a punctured or shortened sequence of bits are transmitted (E<N).

Puncturing refers to non-transmission of coded bits such that the non-transmitted bits are unknown at the receiver and the corresponding LLRs can be set to zero. That is to say when a part of the coded bits is not transmitted on the channel and their value is unknown at the receiver side (i.e., they are punctured) the receiver assumes the same probability for '0' and '1' and this mathematically equals to a zeroed LLR value.

Shortening involves setting input bits to a known value, and non-transmission of coded bits corresponding to those input bits, such that the corresponding LLRs can be set to a large absolute value at the receiver. When a part of the coded bits is known at the receiver side, there is no need to transmit them over the channel (i.e., they are shortened) and the receiver can set their LLR to a large absolute value (i.e. a reliable soft decision) with a sign according to the known bit's value ('0' or '1').

In case of Repetition, the RMS is converted according to:

$$\text{RMS}(LLRs_{input}) = \frac{E}{N} \text{RMS}(LLRs_{channel})$$

In case of repetition, the channel LLRs are a repetitive sequence of the input LLRs to the decoder and thus their RMS can be scaled by E/N to give the RMS of the input LLRs, where E is the amount of transmitted bits over the channel and N is the amount of input LLRs; which equals the amount of coded bits (the code block size).

In case of Puncturing or Shortening it is better to ignore the values of the input LLRs corresponding to non-transmitted coded bits. These are set by the receiver to zero or a large absolute value respectively. This is because the receiver sets these LLRs to plus/minus a predefined value, and thus they cannot be taken into a statistical calculation.

Thus, in the case of puncturing or shortening, the RMS is converted according to:

$$RMS(LLRs_{input}) = RMS(LLRs_{channel})$$

The related α value at the hard decision stage has different amplitude statistics than input LLRs, depending mainly of the code rate R. Code rate R equals D/(F+D) where D is the number of data (information) bits and F is the number of frozen bits per code-block. Since F+D=N where N=the code block size, it can also be said that R=D/N.

The propagated α values for the data bits at the decision stage (at the leaves of the tree, or in case of Fast-SSCL at special nodes), as calculated by the SC decoding algorithm, have higher absolute values in case of a low code rate and lower absolute values in case of a high code rate. This is essentially due to the inherent error correction ability of the code. The differential PM threshold is preferably selected to consider not only the input LLRs statistics (α values at the root of the tree) but also the propagated α values for all stages and up to the decision stage, since at every stage the list can be pruned by the differential PM threshold.

The ratio between the RMS of the α values at the decision stage to the RMS of the input LLRs is inversely proportional to the code rate.

Forcing the estimated values of the frozen bits to their known value strengthens the probability of a correct detection for connected information bits by increasing their related |α| values. This is the inherent code ability to error-correct.

The Polar code construction uses the polarization transform—in the decoding process, the estimated values of the frozen bits are forced to their known values and, as a result, the consecutive estimations of the connected data bits become more reliable.

For lower code rates, meaning more frozen bits, the data bits estimations become even more reliable (compared to higher code rates).

For example if $u_0$ is frozen, then the consecutive estimation of an info bit $u_1$ according to $\alpha_1 = g(\alpha_0^v, \alpha_1^v, 0)$ (assuming $u_0$ is set to '0', although any known value is valid) becomes more reliable. Therefore threshold T is preferably inversely proportional to the code rate; more precisely the Polar mother code rate and not the code rate after rate matching (rate matching being described above).

The threshold is selected according to the Peak-to-Peak amplitude of the input LLRs to the decoder and the code rate:

$$T = 2\sqrt{2} \times RMS(LLRs)/(2R)$$

Where $$RMS(LLRs) = \sqrt{\frac{1}{N}\sum_{i=0}^{N-1}|LLR_i|^2}$$

and R is the code rate (i.e. the mother code rate, independent of rate matching).

Alternately, $$T = \max\{|LLRs|\}/(2R)$$

This formula shows that differential threshold T is preferably set higher in a noisy environment (where the standard deviation of the input LLRs is expected to be higher) and also higher in high code rates (where the error correction ability of the code is weaker) in order not to degrade the decoding sensitivity.

In case of E<N (e.g. Puncturing or Shortening) it is better to ignore the values of the input LLRs corresponding to non-transmitted coded bits. These can be set by the receiver (e.g. to zero or a large absolute value respectively). Thus $$RMS(LLRs) = \sqrt{\frac{1}{E}\sum_{i=0}^{E-1}|LLR_i|^2}$$

for the above equation for T.

If the threshold is set above this value, the decoder latency is increased while error-correction performance is not improved, thus there is no reason to set the threshold above it. If the threshold is set below this value, the decoder latency is decreased and error-correction performance is also decreased; thus it is equivalent to having an SCL decoder with a smaller list size.

The disclosed method provides a multilevel downsizing strategy, where the list size of the SCL decoder dynamically changes at every decoding stage such that the effective list size is between L to 1.

Hence an efficient list pruning strategy is provided by setting a threshold criterion that considers the difference between the median PM and the lowest one:

$PM_{currL/2} - PM_0 \geq T$, where currL≤L is the current list size and the paths are sorted in ascending order of PM.

The provided formulation of the threshold T is optimal for dynamically downsizing the list size without degrading error-correction performance with minimal decoding latency (i.e. minimal effective list size): At low SNRs the effective list size $L_{eff}$ would be close to L; however at high SNRs the effective list size $L_{eff}$ would be close to 1.

However by selecting a non-optimal threshold (a value which is below T as formulated above), this invention gives the flexibility to balance between latency and error-correction performance without the SCL constraint for a list size that is a power of 2, meaning having any effective list size.

FIGS. 6 to 9 show simulation results for various code lengths.

Figure 6:
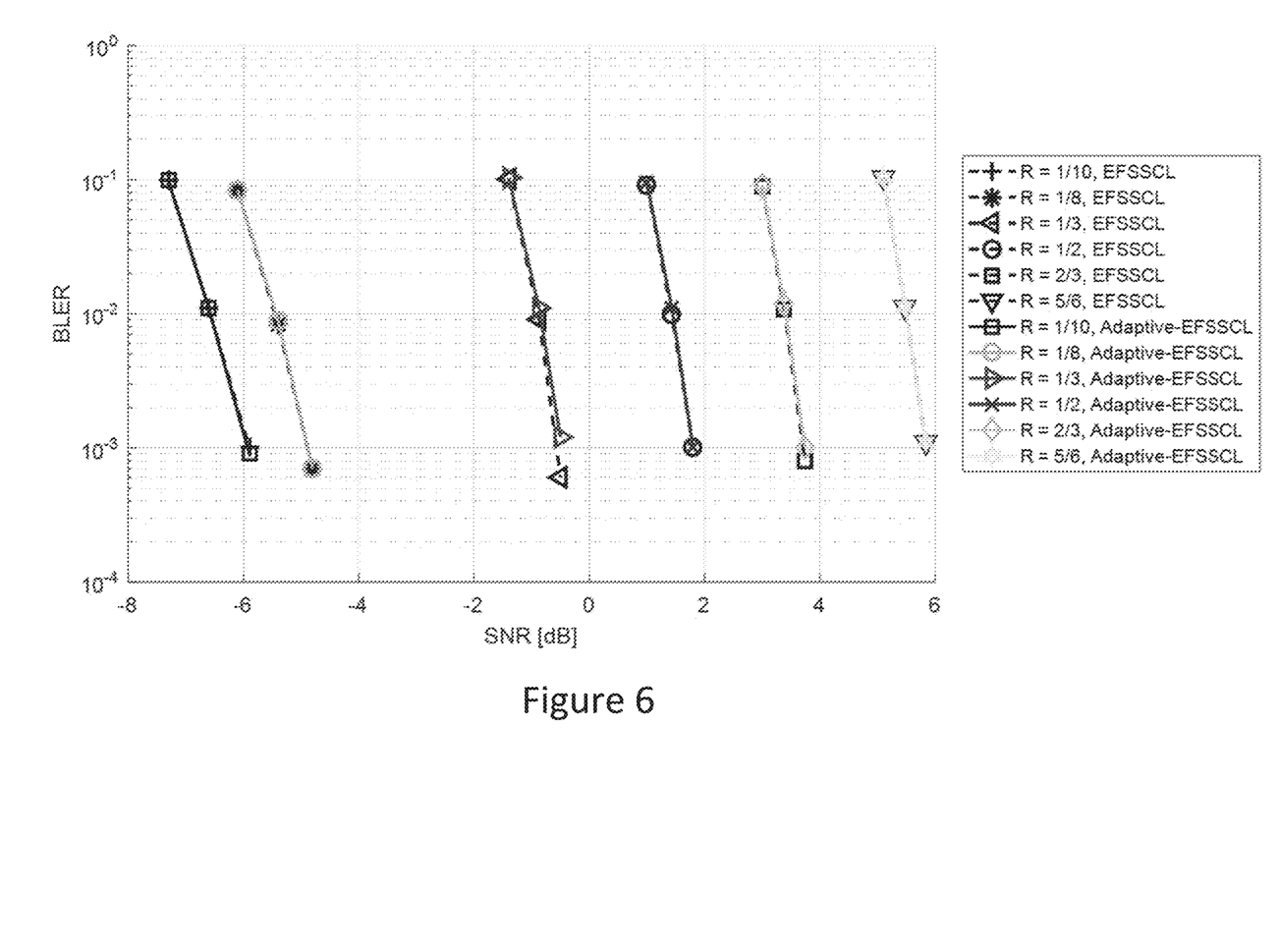
FIG. 6 illustrates BLER performance of non-adaptive and adaptive Enhanced-Fast-SSCL at various code rates. The Enhanced-Fast-SSCL decoder incorporates SCL with Fast-SSC decoders, excluding the SPC nodes, and preserves the error correction performance of SCL decoding.

FIG. 6 illustrates BLER performance of non-adaptive and adaptive Enhanced-Fast-SSCL with a list size of L=32; code length of N=1024 with 24-bit CRC, various code rates of R={1/10, 1/8, 1/3, 1/2, 2/3, 5/6} with QPSK modulated symbols on AWGN channel. As can be seen in the figure, the BLER performance is about the same for adaptive and non-adaptive SCL decoder with the differential PM threshold described herein.

Figure 7:
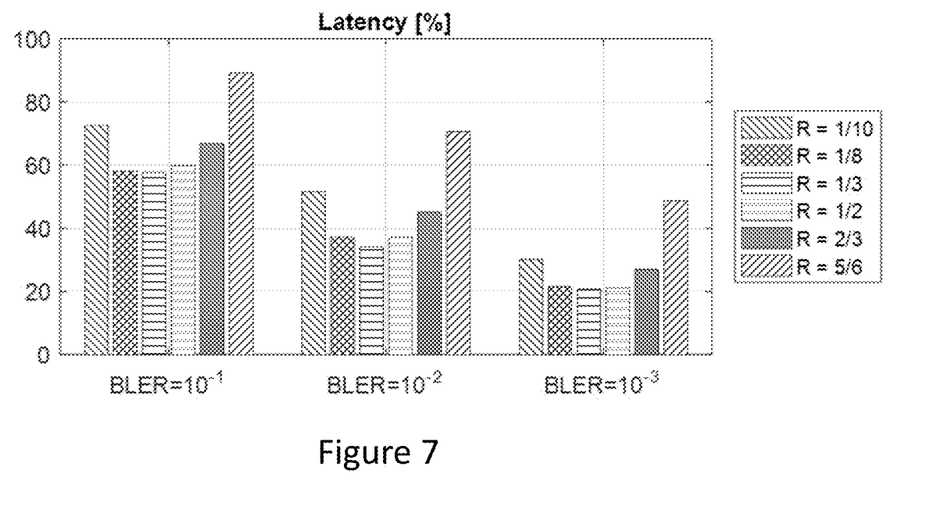
FIG. 7 illustrates an adaptive decoder's latency compared to that of a non-adaptive decoder at various code rates.

FIG. 7 illustrates the adaptive decoder's latency compared to that of a non-adaptive decoder. As can be seen in, the latency is significantly improved due the reduction in clock cycle requirement. The latency of the Adaptive-Enhanced-Fast-SSCL is about 40% less than of Enhanced-Fast-SSCL for L=32 at BLER of $10^{-1}$ (except for very low and very high code rates) and is further reduced at lower BLER.

Figure 8:
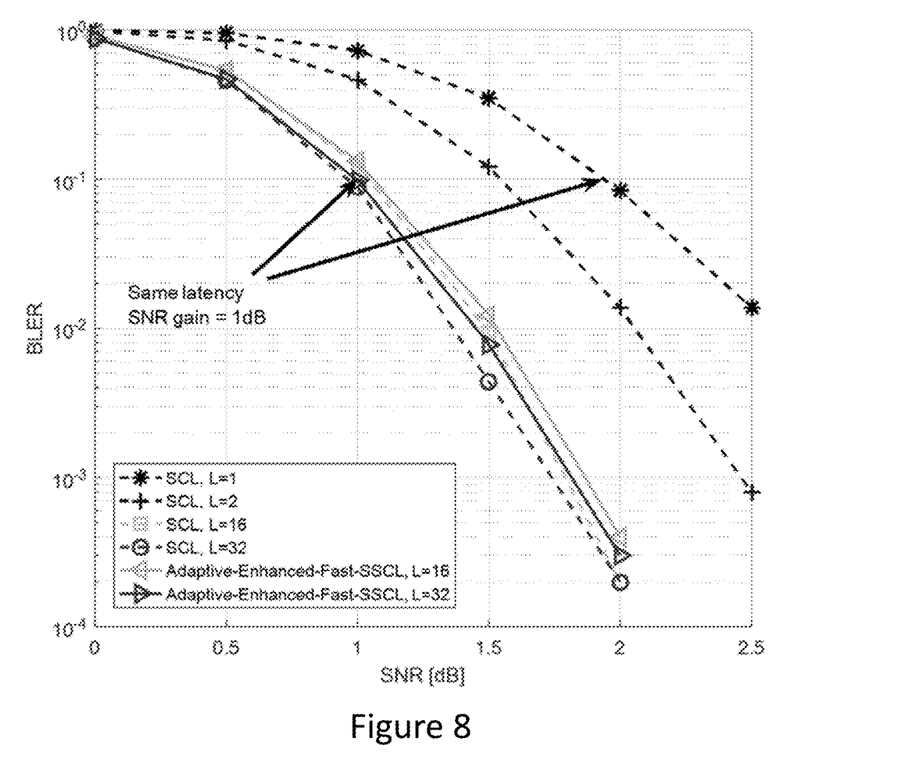
FIG. 8 illustrates BLER performance of SCL and Adaptive-Enhanced-Fast-SSCL.

FIG. 8 shows BLER performance of SCL and Adaptive-Enhanced-Fast-SSCL with list sizes of L={1, 2, 16, 32}; code length of N=1024 with 24-bit CRC, code rate of R=½ with QPSK modulated symbols on AWGN channel. As can be seen, the BLER performance is about the same for adaptive and non-adaptive SCL decoder with the differential PM threshold selection described above (differences are mainly due to the Enhanced-Fast-Simplified techniques that slightly degrade the performance).

Figure 9:
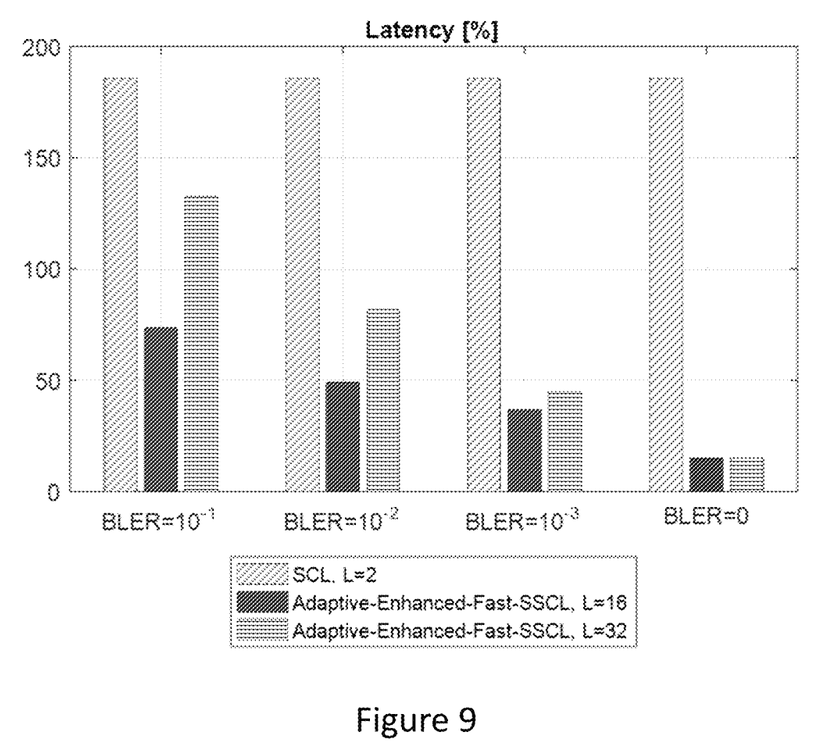
FIG. 9 illustrates SCL and adaptive-Enhanced-Fast-SSCL decoder latency compared to that of an SC decoder.

FIG. 9 shows the Adaptive-Enhanced-Fast-SSCL decoder latency (that keeps improving for lower BLER values until $L_{eff}$ reaches 1) compared to that of SC decoder that has a constant latency. As can be seen in, the latency is significantly improved due to clock cycles' reduction. The latency of the Adaptive-Enhanced-Fast-SSCL with L=32 is comparable to that of SC at BLER of $10^{-1}$ and is further reduced at lower BLER. This can be translated to SNR gain of 1 dB for BLER of $10^{-1}$ ≅ for the same latency and higher SNR gain at lower BLER.

It has been shown that the method of adaptive SCL decoding described herein reduces latency of polar SCL decoders by an order of magnitude compare to regular SCL decoder in good SNR conditions.

Together with the Enhanced-Fast-SSCL algorithm there is a latency reduction of double-magnitude compared to the regular SCL decoder in good SNR conditions.

Combining the differential PM threshold adaptive SCL decoder with an "Early-Termination" algorithm can further decrease the average decoder's latency in bad SNR conditions. Then, the latency can be about the same regardless of the SNR.

The main advantages of the proposed design for an optimal PM threshold for an adaptive-SCL polar decoder algorithm are:
1. preserving the error-correction performance of the non-adaptive decoder
2. significant latency reduction (increased throughput) in good SNR conditions due to reduced amount of clock cycles
3. power consumption is also reduced when latency is low
4. The ability to combine with other techniques for further latency reduction such as the (Further)-Enhanced-Fast-SSCL algorithm that reduces the decoder's tree traversal and the Early-Termination algorithm that may further decrease latency in bad SNR conditions.

Real World Benefits

The differential threshold technique disclosed herein can be combined with Fast-SSCL. Fast-SSCL reduces the tree traversal, however the traversed nodes are list-decoded and so differential threshold list pruning can be utilized to allow a smaller effective list size, which means latency is reduced from both the reduced tree traversal and the reduced amount of processed paths. Throughput is higher when latency is lower.

Early-Termination (ET) is a technique where a codeword is discarded after partial decoding if its distributed CRC is not fully fulfilled. However when not discarded by ET, the decoding proceeds and thus differential threshold list pruning can be applied. Further, ET would reduce latency in lower SNRs and differential threshold list pruning would reduce latency in higher SNRs and therefore when combined the latency is reduced over all SNRs.

As mentioned, the benefit provided by subject matter of this disclosure is latency reduction for SCL-based Polar decoders, which in turn directly affects the decoder throughput: throughput is increased when latency is reduced. Conversely, the error-correction performance is improved while maintaining the same latency. Moreover, flexibility is provided to balance between latency and error-correction performance without the SCL constraint for a list size that is a power of 2.

Polar codes are adopted in 3GPP-NR (5G) for eMBB Downlink and Uplink control channels and for the Broadcast channel, where the code length N can reach up to N=1024. The latency requirements for NR are very restrictive. Complexity reduction is a first priority while preserving the error-correction performance as well.

For example, NR-PDCCH blind decoding (new radio physical downlink control channel) can reach up to 44 candidates per Aggregation Level (AL) where all AL values {1, 2, 4, 8, 16} that are supported by the associated CORESET need to be decoded. That is to say that the allocation of the NR-PDCCH is confined to a CORESET that defines a bank of resources in a consecutive number of PRBs and a consecutive number of OFDM symbols. The specific allocation of the NR-PDCCH is unknown to the UE and there are up to 44 candidates' locations for its location per aggregation level, where the aggregation level defines the NR-PDCCH allocation size. The candidates need to be blindly-decoded, which means a candidate is decoded and if its CRC passes then it is concluded that it has been found. In a worse case, all candidates are decoded which means multiple decodings and thus increased complexity.

Another example is NR-PBCH decoding for multiple hypotheses on the explicit part of the SSB index, moreover it is decoded for multiple beams for beam management. Other examples are NR-URLLC (new radio ultra-reliable low latency communication) and self-contained subframes where the first part conveys the Downlink transmission and the second part conveys the Uplink transmission (e.g. the Uplink needs to immediately ACK/NACK on the Downlink transmission).

These are all examples of when latency reduction has a benefit.

Specifically, for NR-PDCCH and NR-PBCH, in the case of using a Polar decoder of this disclosure, each decoding is aimed at being as efficient as possible (with low latency).

Even if we assume the UE may support multiple Polar decoders in its hardware, and can decode some of the blocks in parallel, the number of PDCCH blocks (44 candidates*5 ALs=220 blocks) and PBCH blocks (up to 64 candidates for carrier frequency above 6 GHz (mmWaves)) is huge. Never the less, with this innovation, the UE may have fewer Polar decoders in its hardware to meet latency requirements (e.g. for real-time processing) and thus silicon area may be decreased.

For NR-URLLC and self-contained subframes, latency is crucial and thus this innovation is beneficial in order to meet error-correction performance requirements. Both error-correction performance and computational complexity are highly related to the SCL decoder list size. With this innovation, a large list size may be selected having the performance (latency) of a much smaller effective list size.

For IoT, especially but not exclusively, power consumption is very important since battery life should hold for several years. This innovation reduces latency and computational complexity, and this is of course beneficial for the power consumption (e.g. the modem can change to sleep mode earlier when processing is finished till its next wake-up time and thus save battery). Further, NR-PDCCH number of repetitions can be high to increase MCL (maximal coupling loss) where a larger MCL allows the modem to be located in extended coverage (a remote area).

The decoder disclosed herein may be implemented on an integrated circuit such as a receiver, transceiver, processor, microprocessor, microcontroller, an FPGA, PLD, or other programmable device, or may be implemented on a bespoke integrated circuit device.

The various methods described above may be implemented by a computer program product. The computer program product may include computer code arranged to instruct a computer or processor to perform the functions of one or more of the various methods described above. The computer program and/or the code for performing such methods may be provided to an apparatus, such as a computer or a processor, on a computer readable medium or computer program product. The computer readable medium may be transitory or non-transitory. The computer readable medium could be, for example, an electronic, magnetic, optical, electromagnetic, infrared, or semiconductor system, or a propagation medium for data transmission, for example for downloading the code over the Internet. Alternatively, the computer readable medium could take the form of a physical computer readable medium such as semiconductor or solid-state memory, magnetic tape, a removable computer diskette, a random-access memory (RAM), a read-only memory (ROM), a rigid magnetic disc, and an optical disk, such as a CD-ROM, CD-R/W or DVD.

An apparatus such as a computer or processor may be configured in accordance with such code to perform one or more processes in accordance with the various methods discussed herein. Such an apparatus may take the form of a data processing system. Such a data processing system may be a distributed system. For example, such a data processing system may be distributed across a network.

The invention claimed is:

1. A method of dynamically changing the list size of a successive cancellation list (SCL) decoder, the SCL decoder arranged to decode data received from a wireless communications system, the method comprising:
    at each successive cancellation stage of the SCL decoder, determining a path metric of each path of the SCL decoder;
    selecting a differential path metric threshold;
    dynamically changing the list size of the SCL decoder based on the differential path metric threshold and the path metric of each path of the cancellation stage, such that decoding sensitivity of the SCL decoder is maintained and/or latency and error-correction performance of the SCL decoder are balanced.

2. The method of claim 1 wherein dynamically changing the list size of the SCL decoder comprises comparing the median path metric with the lowest path metric of the cancellation stage of the SCL decoder; and
    if the difference is more than the differential path metric threshold, half of the paths are removed from the subsequent cancellation stage of the SCL decoder.

3. The method of claim 2 further comprising if the difference in comparing the median path metric with the lowest path metric of the cancellation stage of the SCL decoder is not more than the differential path metric threshold, the amount of paths is doubled to the subsequent cancellation stage of the SCL decoder up to a limit of the list size.

4. The method of claim 1 wherein determining the path metric comprises determining according to a maximum-likelihood metric.

5. The method of claim 1 wherein the path metric is indicative of the maximum likelihood metric of a path.

6. The method of claim 1 wherein path metrics are determined when a frozen bit is encountered wherein the number of paths remain the same.

7. The method of claim 1 wherein path metrics are determined when a data bit is encountered wherein the number of paths is doubled.

8. The method of claim 1 wherein selecting a differential path metric threshold is based on the peak to peak amplitude of input data log-likelihood-ratio statistics and a code rate of the SCL decoder.

9. The method of claim 8 wherein the differential path metric threshold is proportional to the peak to peak amplitude of the input data log-likelihood-ratio statistics and inversely proportional to the code rate.

10. The method of claim 1 wherein a code rate of the SCL decoder comprises D/(F+D) where D is the number of data bits and F is the number of frozen bits per code-block of size N=D+F.

11. The method of claim 1 wherein the SCL decoder comprises a pre-determined list size, the method further comprising reducing the list size of a successive cancellation stage of the SCL decoder to equal the pre-determined list size when the number of paths of the successive cancellation stage is more than the pre-determined list size of the SCL decoder.

12. The method of claim 1 wherein a codeword candidate is discarded after partial decoding if an associated CRC fails.

13. A receiver arranged to receive communication data, the receiver comprising a successive list cancellation decoder as claimed in claim 1.

14. A non-transient computer readable medium comprising instructions that when executed by a processor, cause a processor to carry out the method of claim 1.

* * * * *